(12) United States Patent
Zeng et al.

(10) Patent No.: US 10,814,726 B2
(45) Date of Patent: Oct. 27, 2020

(54) CONTROL APPARATUS AND POWER SUPPLY SYSTEM

(71) Applicant: CONTEMPORARY AMPEREX TECHNOLOGY CO., LIMITED, Ningde, Fujian (CN)

(72) Inventors: Yuqun Zeng, Ningde (CN); Kai Wu, Ningde (CN); Chao Wang, Ningde (CN); Wei Dai, Ningde (CN); Qiandeng Li, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 65 days.

(21) Appl. No.: 16/364,395

(22) Filed: Mar. 26, 2019

(65) Prior Publication Data

US 2020/0094680 A1   Mar. 26, 2020

(30) Foreign Application Priority Data

Sep. 21, 2018  (CN) .......................... 2018 1 1109470

(51) Int. Cl.
*B60L 3/00* (2019.01)
*H01L 47/00* (2006.01)
(Continued)

(52) U.S. Cl.
CPC .......... *B60L 3/0084* (2013.01); *H01H 47/001* (2013.01); *H01H 47/22* (2013.01); *H03K 19/20* (2013.01)

(58) Field of Classification Search
CPC .... B60L 3/0084; H01H 47/001; H01H 47/22; H03K 19/20
See application file for complete search history.

(56) References Cited

U.S. PATENT DOCUMENTS 5,271,474 A * 12/1993 Nishimoto ........... B62D 5/0493
                                              180/404
5,631,796 A    5/1997 Yoshihara et al.
(Continued)

FOREIGN PATENT DOCUMENTS

CN       103762557 A    4/2014
CN       203813699 U    9/2014
(Continued)

OTHER PUBLICATIONS

Extended European Search Report for European Application No. 19165128.0 dated Oct. 21, 2019.
(Continued)

*Primary Examiner* — Dinh T Le
(74) *Attorney, Agent, or Firm* — Heslin Rothenberg Farley & Mesiti P.C.

(57) ABSTRACT

A control apparatus comprises a microcontroller, an auxiliary circuit, a delay module and a logical circuit; the microcontroller is connected to a first input end of the logical circuit via the auxiliary circuit and connected to a second input end of the logical circuit via the delay module, and an output end of the logical circuit is connected to a device to be controlled; if the microcontroller is reset in a process of outputting the closing control signal, a delay disabling signal becomes invalid, the delay module is enabled to output the closing control signal within a preset delay time, wherein the delay time is greater than or equal to a reset time. A power supply system is also provided to avoid a risk that an automobile suddenly loses power due to unexpected reset of the microcontroller.

20 Claims, 4 Drawing Sheets

(51) Int. Cl.
H03K 19/20 (2006.01)
H01H 47/00 (2006.01)
H01H 47/22 (2006.01)

(56) References Cited

U.S. PATENT DOCUMENTS

| | | | | |
|---|---|---|---|---|
| 6,297,569 B1 * | 10/2001 | Bartels | ................. | H01H 47/005 307/113 |
| 7,304,828 B1 | 12/2007 | Shvartsman | | |
| 2015/0210166 A1 | 7/2015 | Nakagawara et al. | | |

FOREIGN PATENT DOCUMENTS

| | | |
|---|---|---|
| CN | 105743062 A | 7/2016 |
| CN | 206040534 U | 3/2017 |
| CN | 106558449 A | 4/2017 |
| CN | 107589699 A | 1/2018 |

OTHER PUBLICATIONS

Choutka, M., "Functional safety solution—Aug. 22, 2012—Infineon Technologies—Dataweek", XP055627391, Retrieved from the Internet: URL:http://www.dataweek.co.za/43184n.
Search Report for Chinese Patent Application No. 201811109470.6 dated Apr. 28, 2020.

* cited by examiner

CONTROL APPARATUS AND POWER SUPPLY SYSTEM

CROSS-REFERENCE TO RELATED APPLICATIONS

This application claims the priority benefit of Chinese Patent Application Serial No. 201811109470.6 filed on Sep. 21, 2018, the entire content of which is incorporated herein by reference.

TECHNICAL FIELD

The present disclosure relates to the fields of electrical controlling, and particularly to a control apparatus and a power supply system.

BACKGROUND

As electric vehicles are important means of transport for going out, their safety is one problem that draws the most attention of consumers and automobile manufacturers. Batteries supply power for electric vehicles, and relays or contactors (hereinafter a relay and a contactor may both be referred to as a relay) are an important component for supplying the power, therefore, it is very important to perform safe and feasible control over a relay.

Therefore, it is desired to provide a safe and feasible control for the relay.

SUMMARY

Some embodiments of the present disclosure aim to provide a control apparatus and a power supply system, so as to avoid a danger that an automobile suddenly loses power due to unexpected reset of a microcontroller.

To solve the above technical problem, some embodiments of the present disclosure provide a control apparatus. The control apparatus includes a microcontroller, an auxiliary circuit, a delay module and a logical circuit. A first signal end of the microcontroller is connected to a first input end of the logical circuit via the auxiliary circuit, a second signal end of the microcontroller is connected to a second input end of the logical circuit via the delay module, and an output end of the logical circuit is connected to a device that is controlled by the control apparatus (hereinafter "a device to be controlled"). When the microcontroller normally operates, a control signal for the device to be controlled is output to the logical circuit through the first signal end, a delay disabling signal is output to the delay module through the second signal end, and the logical circuit outputs the control signal for the device to be controlled. When the microcontroller resets, the auxiliary circuit outputs a closing control signal for the device to be controlled to the logical circuit, and the output of the logical circuit is consistent with that of the delay module. If the microcontroller is reset in a process of outputting a closing control signal, the delay disabling signal becomes invalid, and the delay module is enabled to output the closing control signal within a preset delay time, where the delay time is greater than or equal to a reset time of the microcontroller.

Some embodiments of the present disclosure provide a power supply system. The system includes a relay and the above control apparatus for controlling the relay.

In some embodiments of the present disclosure, compared with existing methods for controlling a relay, when the microcontroller is reset, the auxiliary circuit outputs a closing control signal for the relay module to the logical circuit, and the output of the logical circuit is consistent with that of the delay module. If the microcontroller is reset in a process of outputting a closing control signal, the delay disabling signal becomes invalid, and the delay module is enabled to output the closing control signal within the preset delay time, where the delay time is greater than or equal to the reset time of the microcontroller. Therefore, if the relay module is closed before the reset, the relay module may always remain in a closing state during the reset, thereby avoiding a risk that an automobile suddenly loses power.

In some embodiments of the present disclosure, a control apparatus may further include a safety control module. A third signal end of the microcontroller is connected to a third input end of the logical circuit via the safety control module. The safety control module may include a monitoring unit. When abnormal communication between the monitoring unit and the microcontroller is monitored by the monitoring unit, the monitoring unit may output a disconnection control signal for the device to be controlled, and the output of the logical circuit is consistent with that of the monitoring unit. When software on a microcontroller runs away, the abnormal communication may occur between the monitoring unit and the microcontroller, and the monitoring unit may control the device to be controlled to be disconnected when monitored the abnormal communication, thereby realizing safety control.

In some embodiments of the present disclosure, assuming the closing control signal is a high-level signal and the disconnection control signal is a low-level signal, the safety control module may further include a pull-up circuit and an OR-logic circuit. The third signal end of the microcontroller is connected to a first input end of the OR-logic circuit via the monitoring unit, a fourth signal end of the microcontroller is connected to a second input end of the OR-logic circuit via the pull-up circuit, and an output end of the OR-logic circuit is connected to the third input end of the logical circuit. The fourth signal end of the microcontroller outputs a high-level signal when the microcontroller is powered on and started but does not establish normal communication with the monitoring unit. The fourth signal end of the microcontroller outputs a low-level signal when the microcontroller is in normal communication with the monitoring unit. Since the microcontroller may output a control signal for the device to be controlled after being powered on and started and before establishing the normal communication with the monitoring unit and the monitoring unit may output a low-level signal when monitoring abnormal communication during a period when the microcontroller does not establish normal communication, the device to be controlled cannot be normally controlled by the control signal for the device to be controlled; therefore, the microcontroller may output a high-level signal to the OR-logic circuit through the fourth signal end within this period. In this way, the safety control module still outputs a high-level signal in this period, which will not affect the normal control of the device to be controlled.

In some embodiments of the present disclosure, the monitoring unit is a power source chip. A monitoring function may be implemented by using an existing power source chip without increasing the hardware overhead.

In some embodiments of the present disclosure, the delay module may include a trigger circuit and a delay circuit. The second signal end of the microcontroller is connected to a trigger end of the delay circuit via the trigger circuit, and an output end of the delay circuit is connected to the second input end of the logical circuit. When the delay disabling signal becomes invalid, the trigger circuit triggers the delay circuit to operate by outputting a trigger signal. Preferably, the delay module may also include an anti-misclosing circuit, and the output end of the delay circuit is connected to the second input end of the logical circuit via the anti-misclosing circuit. When the output of the delay circuit is invalid, the anti-misclosing circuit is configured to output a disconnection control signal for the device to be controlled to the second input end of the logical circuit. Therefore, when the output of the delay circuit becomes invalid due to an external interference, the disconnection control signal is output to the logical circuit, thereby avoiding the misclosing caused by the external signal interference.

In some embodiments of the present disclosure, the logical circuit may include an AND-logic circuit. An example of the present disclosure provides an easy and feasible implementation of a logical circuit.

In some embodiments of the present disclosure, the control signal for the device to be controlled may include a high-side control signal and a low-side control signal. The first signal end may include a high-side control end and a low-side control end. The auxiliary circuit may include a high-side auxiliary circuit and a low-side auxiliary circuit. The logical circuit may include two AND-logic circuits. The high-side control end is connected to a first input end of one of the two AND-logic circuits via the high-side auxiliary circuit, and the low-side control end is connected to a first input end of the other of the two AND-logic circuits via the low-side auxiliary circuit. The delay module is connected to second input ends of the two AND-logic circuits respectively. An example of the present disclosure provides one implementation of the logical circuit when the device to be controlled is controlled by the high and low sides at the same time; controlling by the high and low sides can avoid mis-control caused by abnormal control of one side (the high side or the low side), thereby increasing the safety level.

In some embodiments of the present disclosure, the output end of the logical circuit is also connected to a fifth signal end of the microcontroller to feed the control signal for the device to be controlled back to the microcontroller. The microcontroller is configured to record the control signal for the device to be controlled at a moment before the microcontroller is reset and initialize the control signal for the device to be controlled to be same as the control signal for the device to be controlled at the moment before the microcontroller is reset during the initialization after the reset is completed. In the example of the present disclosure, the control apparatus may perform better control on the device to be controlled and better meet the actual needs.

BRIEF DESCRIPTION OF THE DRAWINGS

One or more embodiments will be illustrated with pictures in corresponding accompanying drawings, and these illustrative descriptions do not constitute limitations for the embodiments. Elements with like numerals in the accompany drawings represent similar elements, and there is no proportion limit in the pictures in the accompanying drawings unless otherwise stated.

DETAILED DESCRIPTION

To describe the objects, technical solutions and advantages in embodiments of the present disclosure more clearly, each embodiment of the present disclosure will be described below in detail with reference to the accompanying drawings. However, those of ordinary skill in the art shall understand that many technical details are disclosed in each embodiment of the present disclosure for readers to better understand the present disclosure, and those of ordinary skill in the art may still implement the technical solutions protected by the present disclosure without these technical details and different alterations and modifications based on each embodiment below.

A relay is an electrically operated switch. The relay is usually used in automated control circuits, and may be referred to as an "automatic switch" that uses a small current to control a large current operation. Therefore, the relay plays a role of automatic adjustment, safety protection and conversion circuit in a circuit. A contactor is an electronically controlled switch for switching power supply circuits, and may be used in power, distribution, and electronical applications. The relay and the contactor are functionally indistinguishable and are both a type of a control switch. In the present application, the terms "relay" and "contactor" are used interchangeably.

Figure 1:
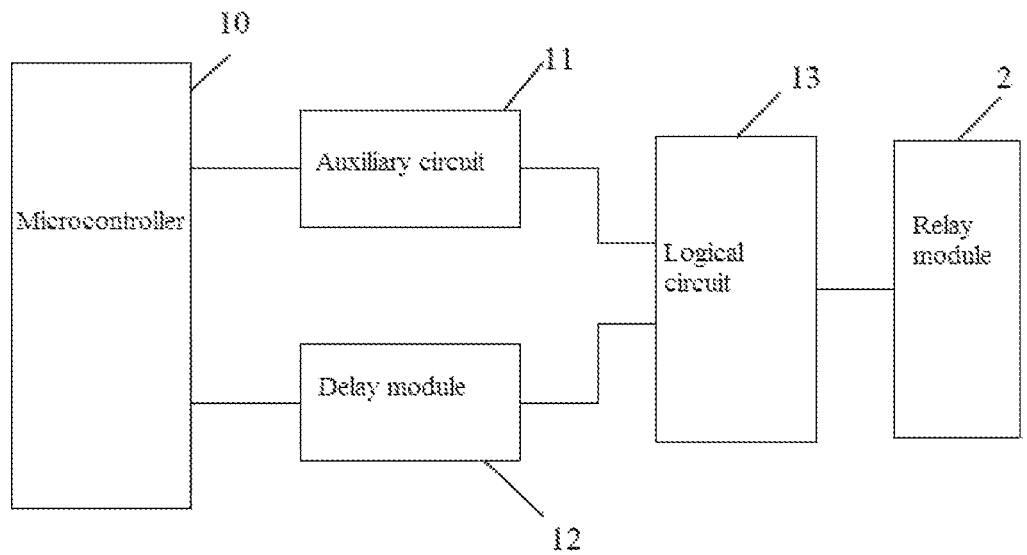
FIG. 1 is a block diagram illustrating an exemplary apparatus for controlling a relay according to a first embodiment of the present disclosure.

At present, a relay is mainly controlled by controlling high and low sides of the relay by using a microcontroller to supply power for a coil end of the relay so that the coil is energized to make contacts of the relay move in one direction. Thus, the attraction and disconnection of the relay are mainly affected by voltage of a power source and a control signal of the high and low sides that are applied to an external coil. In an apparatus for controlling a relay, a situation that a control signal is lost due to unexpected resetting of a microcontroller occurs occasionally, and the loss of control signal results in that the relay is uncontrolled. At this time, the relay may be affected by an external uncertain signal, and a state of the relay cannot be determined, thereby causing a danger. For example, the relay is closed before the unexpected reset. During the unexpectedly resetting of the microcontroller, if the external uncertain signal causes the relay to be disconnected, an automobile may suddenly lose power, thereby leading to a very dangerous situation. The present disclosure provides a control apparatus and a power supply system A first embodiment of the present disclosure relates to an apparatus for controlling a relay. As shown in FIG. 1, a control apparatus includes a microcontroller 10, an auxiliary circuit 11, a delay module 12 and a logical circuit 13. A first signal end of the microcontroller 10 is connected to a first input end of the logical circuit 13 via the auxiliary circuit 11, a second signal end of the microcontroller 10 is connected to a second input end of the logical circuit 13 via the delay module 12, and an output end of the logical circuit 13 is connected to a relay module 2.

When the microcontroller 10 normally operates, a control signal for the relay module is output to the logical circuit 13 through the first signal end, a delay disabling signal is output to the delay module 12 through the second signal end, and the logical circuit 13 outputs a control signal for the relay module 2.

When the microcontroller 10 resets, the auxiliary circuit 11 outputs a closing control signal for the relay module 2 to the logical circuit 13, and the output of the logical circuit is consistent with that of the delay module 12. If the microcontroller 10 is reset in a process of outputting the closing control signal for the relay module 2, the delay disabling signal becomes invalid, and the delay module 12 is enabled to output the closing control signal within a preset delay time, where the delay time is greater than or equal to a reset time of the microcontroller 10.

In this embodiment of the present disclosure, compared with the existing control method, when the microcontroller 10 resets, the auxiliary circuit 11 outputs the closing control signal for the relay module 2 to the logical circuit 13, and the output of the logical circuit 13 is consistent with that of the delay module 12. If the microcontroller 10 is reset when the closing control signal is output, the delay disabling signal becomes invalid, and the delay module 12 is enabled to output the closing control signal within the preset delay time, where the delay time is greater than or equal to the reset time of the microcontroller 10. Therefore, if the relay module is closed before the microcontroller is reset, the relay module may always remain in a closed state during resetting, thereby avoiding a risk that an automobile suddenly loses power.

In an example, when the microcontroller 10 normally operates, a control signal for the relay module is output to the auxiliary circuit 11 through the first signal end, a delay disabling signal is output to the delay module 12 through the second signal end. The output of the auxiliary circuit 11 is consistent with that of the first signal end of the microcontroller 10, and the output of the delay module 12 is consistent with that of the second signal end of the microcontroller 10. The logical circuit 13 performs logic operation to signals received from the first input end and the second input end of the logical circuit 13, and outputs a control signal for the relay module 2 that is consistent with the control signal for the relay module from the first signal end of the microcontroller 10. It is worth noting that the control signals for the relay module include a closing control signal and a disconnection control signal.

When the microcontroller 10 resets, there is no output at the first signal end and the second signal end of the microcontroller 10. The auxiliary circuit 11 outputs a closing control signal for the relay module 2 to the logical circuit 13, and the output of the logical circuit is consistent with that of the delay module 12. If the microcontroller 10 is reset in a process of outputting the closing control signal for the relay module 2, the delay disabling signal becomes invalid, and the delay module 12 is enabled to output the closing control signal within a preset delay time, where the delay time is greater than or equal to a reset time of the microcontroller 10.

Implementation details of the apparatus for controlling a relay shown in FIG. 2 will be described below in detail. The following implementation details are provided only for easy understanding and not required for implementation of the present disclosure.

A relay includes a coil portion and a contact set portion, in which the coil portion may be referred to as an "input loop" or as a relay module in the present disclosure, and a contact set portion may be referred to as an "output loop". Only the coil portion of the relay is shown in the drawings of the present disclosure, and the other parts of the relay should be identical to the existing relays, which are not enumerated here.

The control for the relay module 2 may include a single high-side control manner, a single low-side control manner, and a high and low side control manner. The following descriptions are made with the single high-side control manner as an example.

Figure 2:
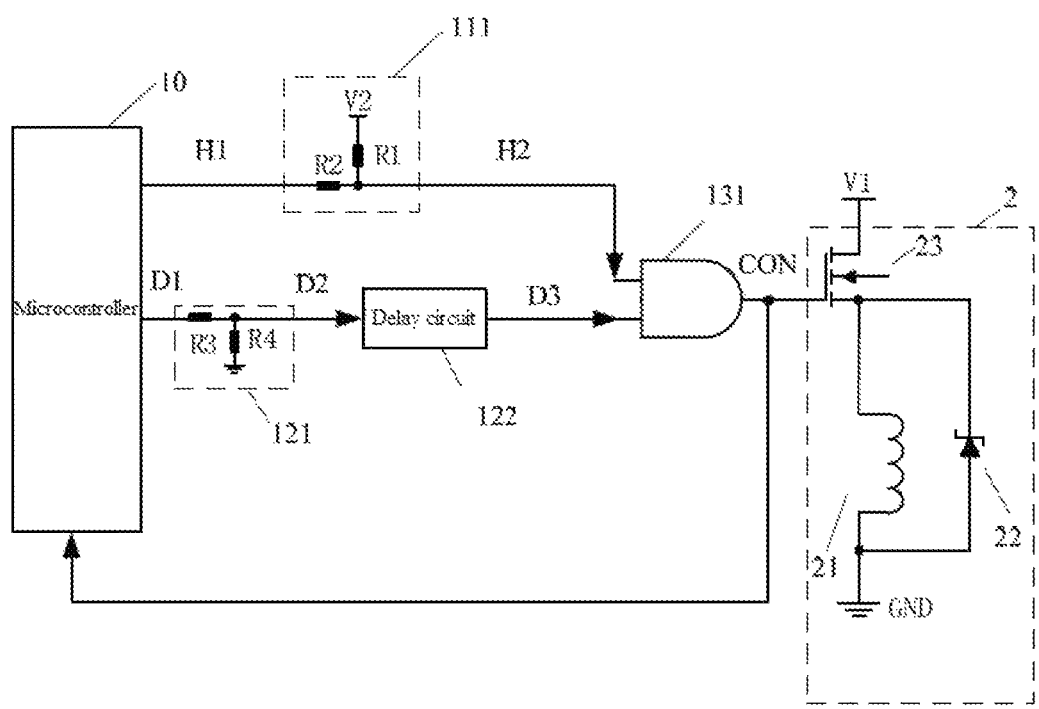
FIG. 2 is a circuit diagram illustrating an exemplary apparatus for controlling a relay according to the first embodiment of the present disclosure.

Referring to FIG. 2, the relay module 2 includes a relay coil 21, a diode 22 forming a freewheeling circuit with the relay coil 21, and a driving circuit. The driving circuit may be, for example, a driving switch 23, which is not limited herein. A first end of the relay coil 21 is connected to a positive pole of a driving power source via the driving switch 23, and a second end of the relay coil 21 is grounded, where the ground is relative to the positive pole of the driving power source and may be understood as system ground (GND) or a negative pole of the driving power source. Here, the system ground (GND) is taken as an example to illustrate. A control end of the driving switch 23 is connected to the output end of the logical circuit 13. The driving power source may be, for example, a voltage source V1, which is not limited herein. The driving power source may alternatively be a current source. In some embodiments, the driving switch 23 is a field effect transistor, and is an N-type field effect transistor. When a high-level signal is applied to the control end of the driving switch 23, the driving switch 23 is closed to close the relay module 2. When a low-level signal is applied to the control end of the driving switch 23, the driving switch 23 is disconnected to disconnect the relay module. Here, the closing of the relay module 2 refers to that a branch, where the relay coil 21 is located, is turned on, and the disconnection of the relay module 2 refers to that the branch, where the relay coil 21 is located, is turned off.

The following descriptions are taken the relay module 2 closed with the high-level signal and the relay module 2 disconnected with the low-level signal as an example. That is, the specific structure of each circuit in FIG. 2 is designed on the precondition that the closing control signal for the relay module 2 is a high-level signal and the disconnection control signal for the relay module 2 is a low-level signal. The closing control signal for the relay module 2 refers to a control signal capable of closing the relay module 2, and the disconnection control signal for the relay module 2 refers to a control signal capable of disconnecting the relay module 2. It is to be noted that if the closing control signal for the relay module 2 is a low-level signal and the disconnection control signal for the relay module 2 is a high-level signal in other examples, the specific structure of each circuit may also be changed. However, those of ordinary skill in the art may perform flexible design based on the function of each circuit of the present disclosure, which shall all belong to the protection scope of the present disclosure.

The logical circuit 13 may include one or more logic circuits. Those of ordinary skill in the art can determine the signals output by the first signal end and the second signal end of the microcontroller and select an appropriate logic circuit according to a specific control strategy.

A circuit structure in some embodiments will be described below in detail, as shown in FIG. 1 and FIG. 2.

In the embodiment shown in FIG. 2, the logical circuit 13 may include an AND-logic circuit 131. A first input end, a second input end, and an output end of the AND-logic circuit 131 may form a first input end, a second input end and an output end of the logical circuit 13 respectively.

The auxiliary circuit 11 is a pull-up circuit 111, and may be referred to as a high-side pull-up circuit 111 if the single high-side control manner is adopted. The high-side pull-up circuit 111 may include a resistor R1, a resistor R2 and a power source V2. A first end of the resistor R1 is connected to the power source V2, a second end of the resistor R1 is connected to a first end of the resistor R2 and connected to a first input end of the AND-logic circuit 131, and a second end of the resistor R2 is connected to a first signal end of the microcontroller 10. The first signal end may be referred to as a high-side control end if the single high-side control manner is adopted in this example. It is to be noted that the first signal end may be referred to as a low-side control end if the single low-side control manner is adopted in other examples.

The delay module 12 may include a trigger circuit 121 and a delay circuit 122. A second signal end of the microcontroller 10 is connected to a trigger end of the delay circuit 122 via the trigger circuit 121, and an output end of the delay circuit 122 is connected to the second input end of the AND-logic circuit 131.

In some embodiments, if the delay circuit 122 is triggered by a falling edge, the trigger circuit 121 may be designed as a pull-down circuit. As shown in FIG. 2, the trigger circuit 121 includes a resistor R3 and a resistor R4. A first end of the resistor R3 is connected to the second signal end of the microcontroller 10, a second end of the resistor R3 is connected to a first end of the resistor R4 and connected to the trigger end of the delay circuit 122, and a second end of the resistor R4 is grounded. A specific structure of the trigger circuit 121 is not limited in the structure shown in FIG. 2, and the specific structure of the trigger circuit 121 is determined by a trigger type of the delay circuit 122. For example, if the delay circuit 122 is triggered by a rising edge, the trigger circuit 121 may be designed as a pull-up circuit.

An operation example of a circuit shown in FIG. 2 will be described below in details. For convenience of description, a path formed by the high-side control end of the microcontroller 10, the high-side pull-up circuit 111, the first input end of the AND-logic circuit 131 may be referred to as a high-side control path of the relay module 2, and the high-side control path may include the following signals: a high-side control signal H1 of the relay module 2 output by the microcontroller 10, and a signal H2 output from the high-side pull-up circuit 111 to the AND-logic circuit 131. A path formed by the second signal end of the microcontroller 10, the delay module 12, and the second input end of the AND-logic circuit 131 may be referred to as a delay control path, and the delay control path may include the following signals: a delay disabling signal D1 output by the microcontroller 10, a signal D2 output by the trigger circuit 121, and a signal D3 output from the delay circuit 122 to the AND-logic circuit 131. Finally, the AND-logic circuit 131 outputs a signal CON to the relay module 2. The signal CON output by the AND-logic circuit 131 is determined by the signal H2 in the high-side control path and the signal D3 in the delay control path.

When the microcontroller 10 normally operates, the high side control signal H1 of the relay module 2 is output to the AND-logic circuit 131 through the high-side control end, and the delay disabling signal D1 is output to the delay module 12 through the second signal end. the signal CON output by the AND-logic circuit 131 is consistent with the high-side control signal H1 of the relay module 2. That is, the signal CON of the AND-logic circuit 131 is the same as the high-side control signal H1 in a normal operating state. The high-side control signal H1 may be a closing control signal or a disconnection control signal. When the signal H1 is a closing control signal, the signal H1 is a high-level signal; and when the signal H1 is a disconnection control signal, the signal H1 is a low-level signal.

There are two cases when the microcontroller 10 is unexpectedly reset, that is, the relay module 2 is in a closing state before the microcontroller is reset, and the relay module 2 is in a disconnecting state before the microcontroller is reset. Descriptions will be made to these two cases as follows.

In the first case, the relay module 2 is in the closing state before the microcontroller is reset.

That is, before the microcontroller is reset:
the high side control path: the signal H1 is at a high level, and the signal H2 is at a high level;
the delay control path: the signal D1 is at a high level (the delay disabling signal is valid), the signal D2 is at a high level (the delay circuit is not triggered), and the signal D3 is at a high level;
the signal CON is at a high level, and the relay module 2 is controlled to be closed; that is, the relay module 2 is in the closing state before the microcontroller is reset.

During the resetting of the microcontroller,
the high-side control path: the high-side control end is suspended, no signal H1 is output, and the signal H2 is at a high level;
the delay control path: the second signal end is suspended, and no signal D1 is output, where the delay disabling signal D1 is changed from the high level to no signal, which indicates that the delay disabling signal D1 becomes invalid; the signal D2 is at a low level, where the signal D2 has a falling edge and the delay circuit 122 is triggered after the microcontroller is reset since the signal D2 is at a high level before the microcontroller is reset; the signal D3 is at a high level and changed to a low level after remaining for the delay time.

The signal CON is at a high level and changed to a low level after remaining for the delay time. Since the signal H2 is always at the high level, the change of the output signal CON is consistent with that of the signal D3 after the signals H2 and D3 pass through the AND-logic circuit 131.

It is to be noted that the invalidity of the delay disabling signal D1 may refer to a process that the delay disabling signal D1 is changed from a high level to no signal (i.e., the second signal end is suspended and no signal D1 is output). That is, the delay disabling signal D1 can be considered as invalid only when the delay disabling signal D1 is at the high level before the microcontroller is reset and changed to no signal when the microcontroller resets. However, the meaning of "the invalidity of the delay disabling signal D1" is not limited to the above. In other examples, the specific meaning of the invalidity of the delay disabling signal D1 may be determined according to actual circuit design as long as the delay circuit 122 is triggered to operate.

Therefore, if the relay module 2 is in the closing state before the microcontroller 10 is reset, the relay module 2 is still in the closing state and remains for a delay time after the microcontroller 10 is reset. Since the delay time is greater than or equal to a reset time of the microcontroller, that is, the relay module 2 can always remain in the closing state during the resetting of the microcontroller 10, thereby avoiding the risk that an automobile suddenly loses power. If the reset is successful, the microcontroller 10 can normally control the relay module 2 again when the microcontroller resets (i.e., the microcontroller 10 is in a normal operating state). If the reset is unsuccessful (the microcontroller 10 may fail and cannot perform normal control), the signal CON is changed into a low-level signal after the delay time to control the relay module 2 to be disconnected, thereby ensuring the safety of the automobile.

In the second case, the relay module 2 is in the disconnecting state before the microcontroller is reset.

Before the microcontroller is reset, the high-side control path: the signal H1 is at a low level, and the signal H2 is at a low level;

the delay control path: the signal D1 is at a low level (the delay disabling signal is valid), the signal D2 is at a low level, and the signal D3 is at a low level;

the signal CON is at a low level, that is, the relay module 2 is disconnected before the microcontroller is reset.

During the resetting of the microcontroller, the high-side control path: the high-side control end is suspended, no signal H1 is output, and the signal H2 is at the high level;

the delay control path: the second signal end is suspended, and no signal D1 is output, where the delay disabling signal D1 is changed from the low level to no signal, which indicates that the delay disabling signal is still valid; the signal D2 is unchanged and the delay circuit 122 is not triggered when the microcontroller resets since the signal D2 is at the low level before the microcontroller is reset; the signal D3 is at the low level (i.e. it is consistent with that before the microcontroller is reset);

the CON is at the low level, where the change of the output signal CON is consistent with that of the signal D3 after the signals H2 and D3 pass through the AND-logic circuit 131 since the signal H2 is always at the high level.

Therefore, if the relay module 2 is in the disconnecting state before the microcontroller 10 is reset, the relay module 2 is still in the disconnecting state when the microcontroller 10 resets. It is to be emphasized that the above high level and low level are described relative to a threshold of the AND-logic circuit 131. That is, the high level refers to a level greater than or equal to the threshold of the AND-logic circuit 131, and the low level refers to a level smaller than the threshold of the AND-logic circuit 131.

It can be seen from the above descriptions that the high-side control end of the microcontroller 10 outputs the high-side control signal H1 when the microcontroller 10 normally operates. Since the signal H2 is always consistent with the signal H1, it may be understood that the high-side control path is used to output the high-side control signal H1 to the logical circuit 13. The second signal end of the microcontroller 10 outputs the delay disabling signal D1, and the delay disabling signal D1 is always consistent with the high side control signal H1 (i.e. when the signal H1 is at the high level, the signal D1 is also at the high level; when the signal H1 is at the low level, the signal D1 is also at the low level), so that the signal D3 finally output by the delay control path is always consistent with the high-side control signal H1. Therefore, when the microcontroller 10 normally operates, the signal CON output from the logical circuit 13 to the relay module 2 is always consistent with the high-side control signal H1.

When the microcontroller 10 is unexpectedly reset (i.e., the microcontroller is suddenly changed from the operating state to a resetting state), the microcontroller 10 fails to perform external control, and each signal end of the microcontroller 10 is in a suspending state without any output. In this case, in the high-side control path, the signal H2 finally output in the high-side control path always remains at the high level due to the action of the high-side pull-up circuit 111. In the delay control path, if the relay module 2 is in the closing state before the microcontroller is reset, the signals D1, D2 and D3 are all at the high level. When the microcontroller is reset, since the signal D1 is invalid, the signal D2 is changed to the low level to generate a falling edge due to the action of the trigger circuit 121 (i.e. the pull-down circuit), thereby triggering the delay circuit 122. After the delay circuit 122 is triggered, the output signal D3 remains at the high level (that is, it is consistent with that before the microcontroller is reset) within the delay time, and changes to the low level after the delay time. Therefore, the relay module 2 will not have the risk of sudden disconnection within the delay time.

The delay circuit 122 may be implemented by an existing delay chip, and parameters in the delay chip may be designed as needed to satisfy the requirement of the delay time. It is only required to ensure that the delay time of the delay circuit 122 is greater than or equal to the reset time of the microcontroller 10.

The above descriptions are made with the single high-side control manner as an example. The single low-side control manner may also be adopted in other embodiments. A difference between the single low-side control manner and the single high-side control manner only lies in that: in the single high-side control manner, the first end of the relay coil 21 is connected to the voltage source V1 via the driving switch 23 and the second end of the relay coil 21 is grounded (GND) (as shown in FIG. 2); in the single low-side control manner, the first end of the relay coil 21 is connected to the power source, and the second end of the relay coil 21 is grounded via the driving switch (not shown). The specific circuit structure of the apparatus for controlling a relay and the control manner are the same, which will not go into details herein.

In other examples, a high and low side control manner can be adopted. In this case, the first end of the relay coil 21 is connected to the voltage source V1 via a first driving switch and the second end of the relay coil 21 is grounded via a second driving switch. The control signal for the relay module may include a high-side control signal and a low-side control signal, and the first signal end may include a high-side control end and a low-side control end. The auxiliary circuit may include a high-side auxiliary circuit and a low-side auxiliary circuit, and the logical circuit may include two AND-logic circuits. The high-side control end is connected to a first input end of one of AND-logic circuits via the high-side auxiliary circuit; the low-side control end is connected to a first input end of the other of AND-logic circuits via the low-side auxiliary circuit. The output end of the delay module is connected to a second input end of the two AND-logic circuits respectively. An output end of the one of AND-logic circuits is connected to a control end of the first driving switch and an output end of the other of AND-logic circuits is connected to a control end of the second driving switch.

In some embodiments, the output end of the logical circuit 13 may also be connected to the fifth signal end of the microcontroller 10. For example, the output end of the AND-logic circuit 131 in FIG. 2 may also be connected to the microcontroller 10 to feed the signal CON back to the microcontroller 10. The microcontroller 10 may record the state of the relay module 2 (closing state or disconnecting state) at the moment before the microcontroller is reset, so that the control signal for the relay module 2 may be initialized to be the same as the control signal for the relay module 2 at the moment before the microcontroller is reset during the initialization after the reset is completed; that is, the state of the initialized relay module 2 is consistent with that before the microcontroller is reset. For example, when the relay module 2 is in the closing state before the microcontroller is reset, the relay module 2 is initialized to the closing state in the initialization after the microcontroller is reset. In the example of the present disclosure, the apparatus for controlling a relay may perform better control on the relay module and better meet the actual needs. In other examples, the microcontroller 10 may obtain the state of the relay module 2 in another manner. For example, the state of the relay module 2 may be determined by obtaining the signals H1 and D1.

In some embodiments, it is to be noted that the control apparatus in the present disclosure may also perform control for other loads, such as a contactor or an electric motor, in addition to performing control on the relay. In the case of controlling the electric motor, the relay module 2 in FIG. 2 can be seen as windings of the electric motor, and the control apparatus is used to control power-on and power-off of the windings.

In some embodiments, a fault may be reported or an alarm may be sent in a preset manner during the reset. For example, when the relay module 2 and the apparatus for controlling a relay are applied to an automobile, a driver may be alerted to further improve the safety level of the automobile (e.g. the driver may actively take countermeasures after receiving the alert).

Figure 3:
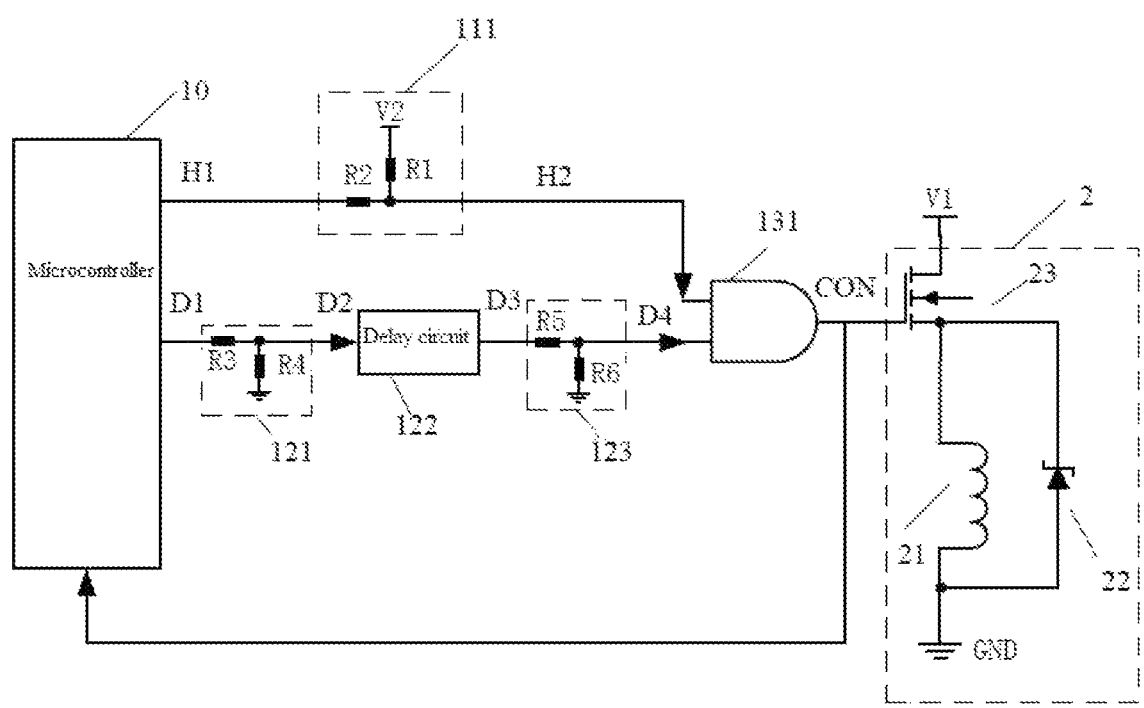
FIG. 3 is a circuit diagram illustrating an exemplary apparatus for controlling a relay according to a second embodiment of the present disclosure.

A second embodiment of the present disclosure relates to an apparatus for controlling a relay. The second embodiment is substantially same as the first embodiment, and is improved as follows: in the second embodiment of the present disclosure, as shown in FIG. 3, the delay module 12 also includes an anti-misclosing circuit 123, and the output end of the delay circuit 122 is connected to the second input end of the AND-logic circuit 131 via the anti-misclosing circuit 123.

When the output of the delay circuit 122 is invalid due to an external interference, the anti-misclosing circuit 123 is configured to output a disconnection control signal to the AND-logic circuit 131, so that the AND-logic circuit 131 outputs the disconnection control signal to the relay module 2 to avoid the misclosing caused by the external signal interference. In the control apparatus shown in FIG. 3, if the disconnection control signal is a low-level signal, the anti-misclosing circuit 123 is a pull-down circuit which specifically includes a resistor R5 and a resistor R6. A first end of the resistor R5 is connected to the output end of the delay circuit 122, a second end of the resistor R5 is connected to a first end of the resistor R6 and connected to the second input end of the AND-logic circuit 131, and a second end of the resistor R6 is grounded. It is to be noted that a specific structure of the anti-misclosing circuit 123 may be designed as required.

In this case, the delay control path may further include a signal D4. That is, the delay circuit 122 outputs a signal D3 to the anti-misclosing circuit 123, and the anti-misclosing circuit 123 outputs a signal D4 to the second input end of the AND-logic circuit 131.

When the signal D3 is at a high level, the signal D4 is also at a high level. When the signal D3 is at a low level, the signal D4 is also at a low level. When the output of the delay circuit 122 is invalid due to the external interference, the signal D4 output by the pull-down circuit is at the low level. That is, when the signal D3 output by the delay circuit 122 is normal, the signal D4 is consistent with the signal D3. When the output of the signal D3 is invalid due to the external interference, the signal D4 is at the low level to avoid the misclosing of the relay module 2.

Under normal circumstances, the relay module 2 is in the disconnecting state, and the signals D1 and D3 should be at the low level. However, the invalidation of the delay circuit 122 results in that the signal D3 may be changed from the low level to the high level due to an external interference. In the absence of the anti-misclosing circuit 123, the high level of the signal D3 is directly input to the AND-logic circuit 131, which makes it possible for the relay module 2 to change from the disconnecting state to the closing state (i.e. the misclosing of the relay module 2 is generated). In the presence of the anti-misclosing circuit 123, the signal D4 is clamped at a low level by the resistor R6 to avoid the misclosing of the relay module 2.

Figure 4:
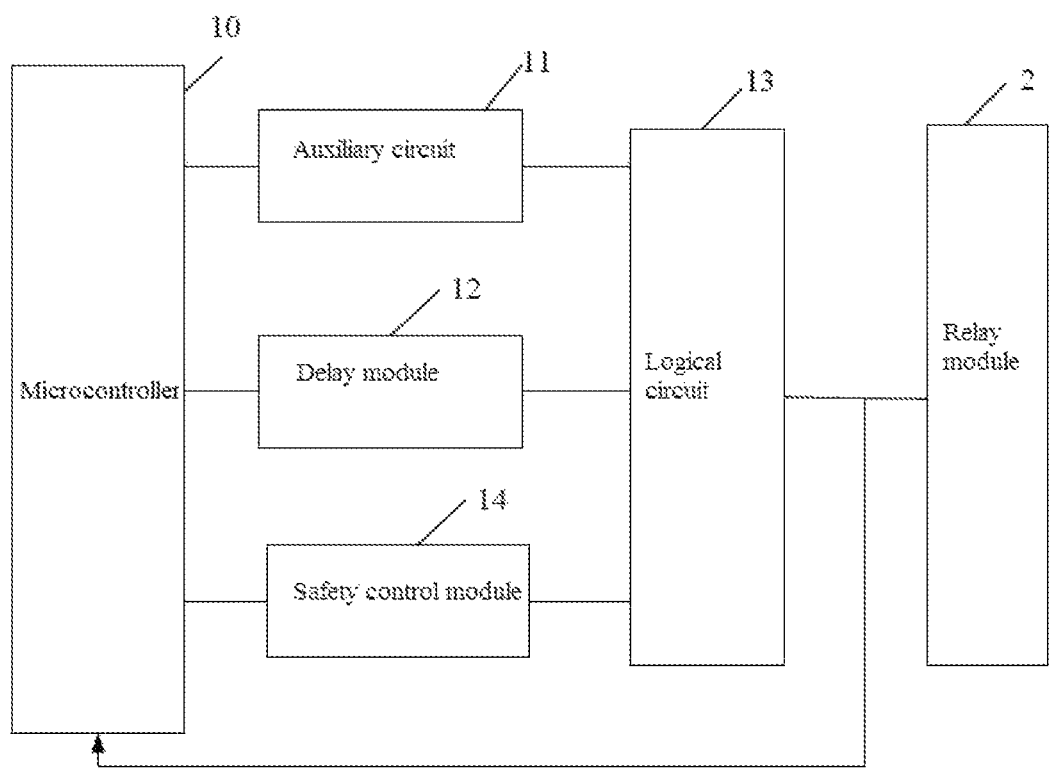
FIG. 4 is a block diagram illustrating an exemplary apparatus for controlling a relay according to a third embodiment of the present disclosure.
Figure 5:
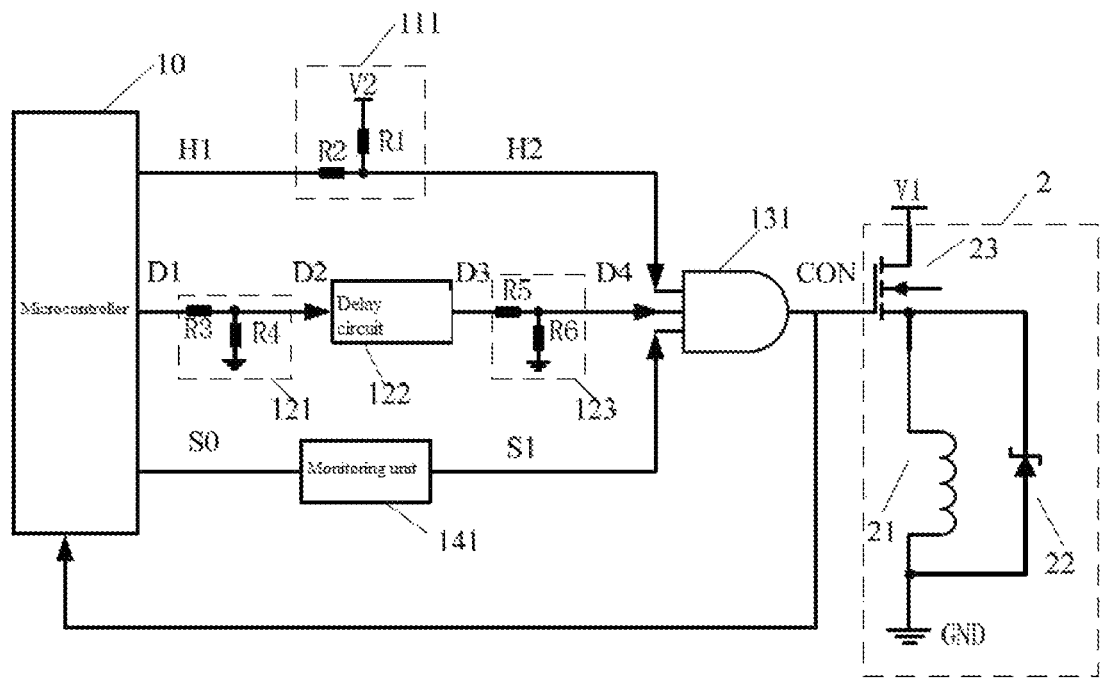
FIG. 5 is a circuit diagram illustrating an exemplary apparatus for controlling a relay according to the third embodiment of the present disclosure.

A third embodiment of the present disclosure relates to an apparatus for controlling a relay. The third embodiment is substantially same as the second embodiment, and is improved as follows: in the third embodiment of the present disclosure, as shown in FIG. 4 and FIG. 5, the control apparatus further includes a safety control module 14, the third signal end of the microcontroller 10 is connected to the third input end of the logical circuit 13 via the safety control module 14. The safety control module 14 includes a monitoring unit 141. When abnormal communication between the monitoring unit 141 and the microcontroller 10 is monitored, the monitoring unit 141 outputs a disconnection control signal for the relay module 2. The output of the logical circuit 13 is consistent with that of the monitoring unit. To be specific, the logical circuit 13 performs logic operation on signals received from the first input end, the second input end and the third input end, to make the output of the logical circuit 13 be consistent with that of the monitoring unit.

Specifically, the monitoring unit 141 is connected between the third signal end of the microcontroller 10 and the third input end of the AND-logic circuit 131. The monitoring unit 141 is configured to monitor the communication with the microcontroller 10 to identify whether the microcontroller 10 suffers a software runaway. When the microcontroller 10 normally operates, the monitoring unit 141 is in normal communication with the microcontroller 10 (for example, interacts signals periodically or receives signals from the microcontroller 10 periodically). When the microcontroller 10 suffers a software runaway, the communication between the microcontroller 10 and the monitoring unit 141 will be abnormal. In some embodiments, the monitoring unit 141 may be implemented by a power source chip. Since the power source chip is provided in an existing circuit (e.g. supplying power for the microcontroller 10), it is not desired to additionally arrange a component. However, the monitoring unit is not limited to the power source chip. A monitoring unit may be specially provided to monitor the functions of the microcontroller 10. For example, the monitoring unit may be a watchdog circuit.

A working principle of a circuit shown in FIG. 5 will be described below in detail. A path formed by the microcontroller 10, the safety control module 14, and the third input end of the AND-logic circuit 131 may be referred to as a safety control path, and the safety control path may include the following signals: a communication signal S0 between the monitoring unit 141 and the microcontroller 10, and a signal S1 output by the monitoring unit 141. If the monitoring unit 141 periodically receives the communication signal S0 from the microcontroller 10, it may be understood that the communication signal S0 is normal, that is, the communication is normal; otherwise, it indicates that the communication is abnormal.

Before the software runs away,
the high-side control path: the signal H2 is consistent with the signal H1;
the delay control path: the signals D1, D2, D3 and D4 are all consistent with the signal H1;
the safety control path: the signal S0 is normal, and the signal S1 is at a high level;
the signal CON is consistent with the signal H1.

After the software runs away,
the high side control path: the signals H1 and H2 both remain in the state at a moment before the software runs away;
the delay control path: the signals D1, D2, D3 and D4 all remain in the state at the moment before the software runs away;
the safety control path: the signal S0 is abnormal, and the signal S1 is at the low level;
the signal CON is at the low level to control the relay module 2 to be disconnected.

Since the signal CON output by the AND-logic circuit 131 is jointly determined by the signals H2, D4 and S1, and the signal S1 is at the low level, the signal CON is always at the low level no matter which level the signals H2 and D4 are at; therefore, as long as the microcontroller 10 suffers the software runaway, the relay module 2 will be disconnected, thereby implementing the safety control.

After the microcontroller 10 is powered on and started, the microcontroller 10 may attempt to establish a communication connection with the monitoring unit 141, and the process of attempting to establish communication connection may take some time. Before the connection is established, the signals S0 monitored by the monitoring unit 141 are always abnormal, and the output signals S1 are at the low level. Usually, after the microcontroller 10 is powered on and started and before the microcontroller 10 establishes normal communication with the monitoring unit 141, the microcontroller 10 may output the high-side control signal H1 to control the relay module 2. That is, after the microcontroller 10 is powered on and started, the microcontroller 10 may output the high-side control signal H1 at a moment earlier than the moment when the microcontroller 10 completes establishment of communication connection with the monitoring unit 141.

A time period between a first moment and a second moment is denoted as T1, where the first moment is a moment when the microcontroller 10 starts to output the high-side control signal H1 after the microcontroller 10 is powered on and started, and the second moment is a moment when the microcontroller 10 completes the establishment of the communication connection with the monitoring unit 141. In FIG. 5, the safety control module 14 only includes the monitoring unit 141, the output S1 of the monitoring unit 141 is the output of the safety control module 14. Since the signal S1 output by the monitoring unit 141 in the time period T1 is at the low level, the signal CON output by the AND-logic circuit 131 may be directly caused to be at the low level. That is, the misclosing occurs since the signal CON is not controlled by the high-side control signal H1.

The microcontroller 10 is required to output the high-side control signal H1 only after it is monitored that the communication connection is successfully established between the microcontroller 10 and the monitoring unit 141 so that the misclosing can be avoided.

The microcontroller 10 is capable of performing normal communication with the monitoring unit 141 during normal operation. That is, when the microcontroller 10 normally operates, the signal S0 is normal, and the signal S1 is at the high level. Thus, when the microcontroller 10 normally operates, the signal output from the AND-logic circuit 131 to the relay module 2 will not be affected by the signal S1. When the microcontroller 10 is reset, since the monitoring unit 141 does not establish communication connection with the microcontroller 10, the signal S0 is abnormal at this time. The monitoring unit 141 may be configured to enable the signal S1 to be at the low level after a preset waiting time when monitoring that the signal S0 is abnormal, where the waiting time may be set to be greater than or equal to the delay time of the delay module 12, so that the signal output from the AND-logic circuit 131 to the relay module 2 will not be affected by the signal S1 and still keeps consistent with the delay signal when the microcontroller 10 is unexpectedly reset. That is, when the microcontroller 10 is unexpectedly reset, the safety control path does not perform any control function.

It is to be noted that some embodiments may also be examples improved based on the first embodiment. That is, the control apparatus in FIG. 5 is an example of adding a safety control module to the control apparatus in FIG. 3. However, the control apparatus is not limited to this case. In some embodiments, the control apparatus can be an example of adding a safety control module to the control apparatus in FIG. 2.

It is to be emphasized that FIG. 4 and FIG. 5 illustrate a feedback path from the logical circuit 13 to the microcontroller 10 (i.e. the signal CON is fed back to the microcontroller). However, the control apparatus is not limited to this case. This feedback path is optional rather than compulsory.

Figure 6:
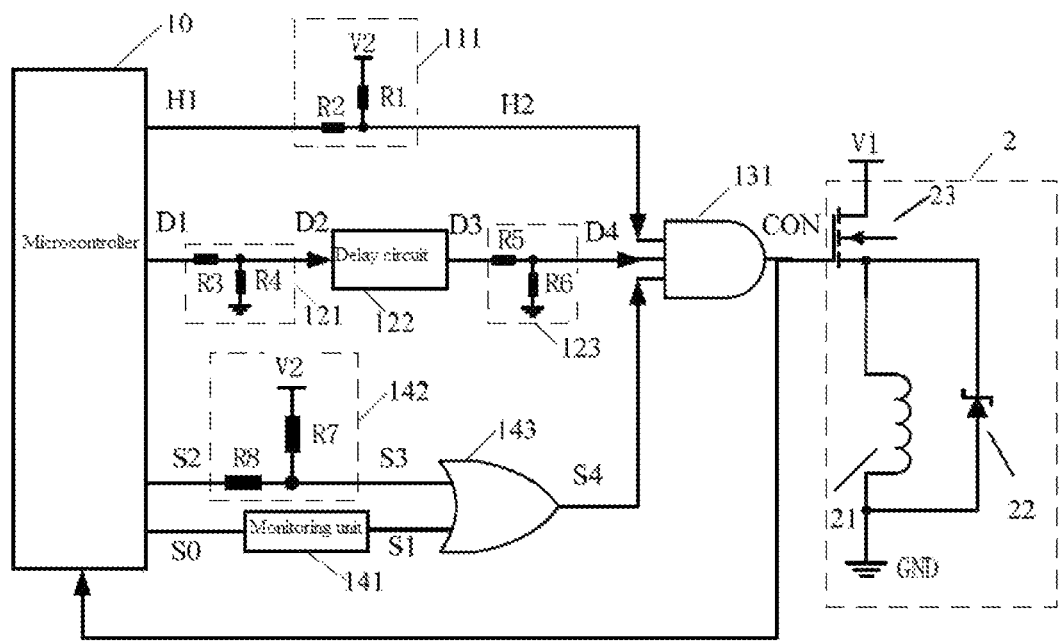
FIG. 6 is a circuit diagram illustrating an exemplary apparatus for controlling a relay according to a fourth embodiment of the present disclosure.

A fourth embodiment of the present disclosure relates to an apparatus for controlling a relay. The fourth embodiment is substantially same as the third embodiment, and is improved as follows: in the fourth embodiment of the present disclosure, as shown in FIG. 6, the safety control module 14 further includes a pull-up circuit 142 and an OR-logic circuit 143. The third signal end of the microcontroller 10 is connected to a first input end of the OR-logic circuit 143 via the monitoring unit, the fourth signal end of the microcontroller 10 is connected to a second input end of the OR-logic circuit 143 via the pull-up circuit 142, and an output end of the OR-logic circuit 143 is connected to the third end of the AND-logic circuit 131.

Specifically, the pull-up circuit 142 may include a resistor R7, a resistor R8 and a power source V2. The pull-up circuit 142 and the high-side pull-up circuit 111 may share one power source V2. A first end of the resistor R7 is connected to the power source V2, a second end of the resistor R7 is connected to a first end of the resistor R8 and connected to the second input end of the OR-logic circuit 143, and a second end of the resistor R8 is connected to the fourth signal end of the microcontroller 10.

In FIG. 6, the safety control path may further include: a signal S2 output by the fourth signal end of the microcontroller 10, a signal S3 output by the pull-up circuit 142, and a signal S4 output by the OR-logic circuit 143.

In FIG. 6, in the time period T1, the signal S2 output by the fourth signal end of the microcontroller 10 is at the high level, and the signal S4 is at the high level after the OR-logic circuit 143 receives the signal S3 (high level) and the signal S1 (low level), so that the signal CON is not affected by the signal S1 within the time period T1 and always remains consistent with the high-side control signal H1. That is, the normal control for the relay module 2 can also be implemented within the time period T1.

After the software runs away for a period (the specific time may be determined according to actual setting), the monitoring unit 141 may trigger the microcontroller 10 to be reset. During the reset of the microcontroller 10, since the monitoring unit 141 does not establish communication connection with the microcontroller 10 (which may be understood as within the time period T1), the signal S0 is abnormal, the signal S1 is at the low level, the fourth signal end is suspended with no output, and no signal S2 is output, but the signal S3 is pulled up to the high level due to the action of the pull-up circuit 142. Therefore, the signal S4 output by the OR-logic circuit 143 is at the high level, so that the signal S4 output in the path of the safety control module 14 will not cause the relay module 2 to be disconnected.

Therefore, the microcontroller 10 can implement normal control for the relay module 2 as early as possible after being powered on and started. Also, no control burden may be increased for the microcontroller 10.

A fifth embodiment of the present disclosure relates to an apparatus for controlling a relay. The fifth embodiment is substantially same as the fourth embodiment, and is improved as follows: in the fourth embodiment of the present disclosure, the control apparatus of the relay module 2 adopts the single high-side control manner or the single low-side control manner, but in the fifth embodiment of the present disclosure, the control apparatus of the relay module 2 adopts the high and low side control manner.

Figure 7:
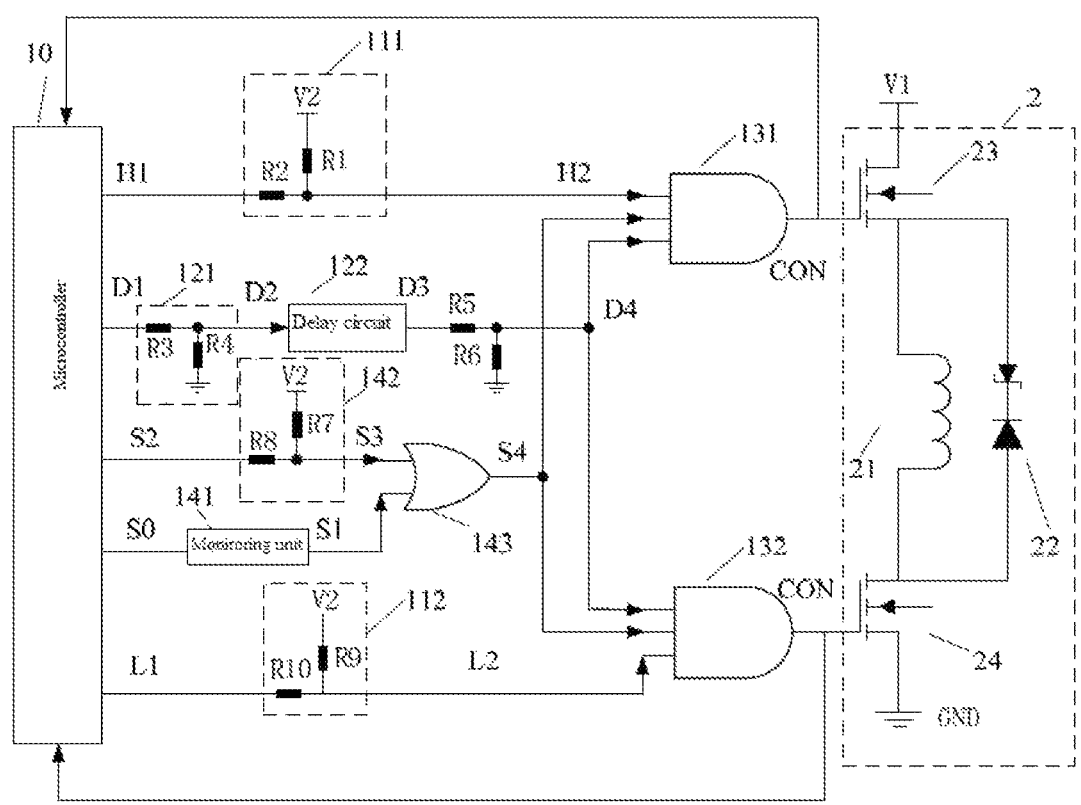
FIG. 7 is a circuit diagram illustrating an exemplary apparatus for controlling a relay according to a fifth embodiment of the present disclosure.

As shown in FIG. 7, the driving circuit in the relay module 2 includes two driving switches 23 and 24, the first end of the relay coil 21 is connected to the voltage source V1 via the driving switch 23, and the second end of the relay coil 21 is grounded (GND) via the driving switch 24.

The control signal for the relay module 2 may include a high-side control signal H1 and a low-side control signal L1. The first signal end of the relay module 2 may include a high-side control end and a low-side control end. The auxiliary circuit 11 may include a high-side auxiliary circuit and a low-side auxiliary circuit, where the high-side auxiliary circuit is a high-side pull-up circuit 111, and the low-side auxiliary circuit is a low-side pull-up circuit 112. The logical circuit 13 may include two AND-logic circuits 131 and 132.

The high-side control end of the relay module 2 is connected to a first input end of the AND-logic circuit 131 via the high-side pull-up circuit 111; the low-side control end of the relay module 2 is connected to a first input end of the AND-logic circuit 132 via the low-side pull-up circuit 112. The output end of the delay module 12 is connected to a second input end of the AND-logic circuit 131 and a second input end of the AND-logic circuit 132 respectively, and the output end of the safety control module 14 is connected to a third input end of the AND-logic circuit 131 and a third input end of the AND-logic circuit 132 respectively. Specific structures of the high-side pull-up circuit 111, the delay module 12, and the safety control module 14 are described in the above embodiments, which will not go into details herein. The low-side pull-up circuit 112 will be described below in detail.

Specifically, the low-side pull-up circuit may include a resistor R9, a resistor R10 and a power source V2. The low-side pull-up circuit 112 and the high-side pull-up circuit 111 may share one power source V2. A first end of the resistor R9 is connected to the power source V2, a second end of the resistor R9 is connected to a first end of the resistor R10 and connected to a first output end of the AND-logic circuit 132. A second end of the resistor R10 is connected to a low-side control end of the microcontroller 10.

A path formed by the low-side control end of the microcontroller 10, the low-side pull-up circuit 112, and the first input end of the AND-logic circuit 132 may be referred to as a low-side control path of the relay module 2, and the low-side control path of the relay module 2 may include the following signals: a low-side control signal L1 for the relay module 2 output by the microcontroller 10, a signal L2 output by the low-side pull-up circuit 112 to the AND-logic circuit 132. When the microcontroller 10 is in different states (normal operation, unexpected reset or software runaway), the control manners of the low-side control circuit and the high-side control circuit are completely same; that is, the low-side control signal L1 is the same as the high-side control signal H1, and the signal L2 is also the same as the signal H2. The signal CON output by the AND-logic circuit 131 is used to control the driving switch 23, and the signal CON output by the AND-logic circuit 132 is used to control the driving switch 24.

In some embodiments, the signal CON output by the AND-logic circuit 131 in the high-side control path and the signal CON output by the AND-logic circuit 132 in the low-side control path are fed back to the microcontroller 10 respectively. However, the control apparatus is not limited herein. In other embodiments, since the low-side control signal L1 is the same as the high-side control signal H1, that is, the signal CON output by the AND-logic circuit 131 is the same as the signal CON output by the AND-logic circuit 132, one of the signal CON output by the AND-logic circuit 131 and the signal CON output by the AND-logic circuit 132 may be fed back to the microcontroller 10. Feeding back the signals CON of the high side and the low side at the same time may avoid a feedback error caused by a failure of one of the control paths.

It is to be noted that this embodiment may also be an example improvement based on any one of the first embodiment to the third embodiment.

A sixth embodiment of the present disclosure relates to a power supply system. The system includes a relay and the apparatus for controlling a relay in any one of the first embodiment to the fifth embodiment. The power supply system may be applied to electrical equipment such as an electric automobile.

It can be easily found that this embodiment is a system embodiment corresponding to any one of the first embodiment to the fifth embodiment, and this embodiment may be implemented in cooperated with any one of the first embodiment to the fifth embodiment. Relevant technical details mentioned in any one of the first embodiment to the fifth embodiment are still effective in this embodiment, and will not go into details herein. Correspondingly, the relevant technical details mentioned in this embodiment may also be applied to any one of the first embodiment to the fifth embodiment.

It is to be noted that each module involved in this embodiment is a logical module. In a practical application, one logical unit may be a physical unit, or a part of a physical unit, or may be implemented by a combination of a plurality of physical units. Further, to highlight an innovative part of the present disclosure, a unit that is less closely related to the solution of the technical problem of the present disclosure is not introduced in this embodiment, but this does not mean that no other units exist in this embodiment.

Those of ordinary skill in the art may understand that the above embodiments are merely specific examples of the present disclosure. In a practical application, different alterations may be made to forms and details within the scope of the present disclosure.

What is claimed is:

1. A control apparatus, comprising a microcontroller, an auxiliary circuit, a delay module and a logical circuit;
   wherein a first signal end of the microcontroller is connected to a first input end of the logical circuit via the auxiliary circuit, a second signal end of the microcontroller is connected to a second input end of the logical circuit via the delay module, and an output end of the logical circuit is connected to a device to be controlled;
   wherein when the microcontroller normally operates, a control signal for the device to be controlled is output to the logical circuit through the first signal end, a delay disabling signal is output to the delay module through the second signal end, and the logical circuit outputs the control signal for the device to be controlled;
   wherein when the microcontroller resets, the auxiliary circuit outputs a closing control signal for the device to be controlled to the logical circuit, and the output of the logical circuit is consistent with the output of the delay module; If the microcontroller is reset in a process of outputting a closing control signal, the delay disabling signal becomes invalid, and the delay module is enabled to output the closing control signal within a preset delay time, wherein the delay time is greater than or equal to a reset time of the microcontroller.

2. The apparatus according to claim 1, wherein the control apparatus further comprises a safety control module, and a third signal end of the microcontroller is connected to a third input end of the logical circuit via the safety control module;
   the safety control module comprises a monitoring unit; when abnormal communication between the monitoring unit and the microcontroller is monitored by the monitoring unit, the monitoring unit outputs a disconnection control signal for the device to be controlled, and the output of the logical circuit is consistent with the output of the monitoring unit.

3. The apparatus according to claim 2, wherein the closing control signal is a high-level signal, and the disconnection control signal is a low-level signal; the safety control module further comprises a pull-up circuit and an OR-logic circuit;
   the third signal end of the microcontroller is connected to a first input end of the OR-logic circuit via the monitoring unit, a fourth signal end of the microcontroller is connected to a second input end of the OR-logic circuit via the pull-up circuit, and an output end of the OR-logic circuit is connected to the third input end of the logical circuit;
   the fourth signal end of the microcontroller outputs a high-level signal when the microcontroller is powered on and started but does not establish normal communication with the monitoring unit; the fourth signal end of the microcontroller outputs a low-level signal when the microcontroller is in normal communication with the monitoring unit.

4. The apparatus according to claim 2, wherein the monitoring unit is a power source chip.

5. The apparatus according to claim 1, wherein the delay module comprises a trigger circuit and a delay circuit;
the second signal end of the microcontroller is connected to a trigger end of the delay circuit via the trigger circuit, and an output end of the delay circuit is connected to the second input end of the logical circuit;
   when the delay disabling signal becomes invalid, the trigger circuit triggers the delay circuit to operate by outputting a trigger signal.

6. The apparatus according to claim 5, wherein the delay module further comprises an anti-misclosing circuit, and the output end of the delay circuit is connected to the second input end of the logical circuit via the anti-misclosing circuit;
   the anti-misclosing circuit is configured to output the disconnection control signal for the device to be controlled to the second input end of the logical circuit when the output of the delay circuit is invalid.

7. The apparatus according to claim 6, wherein the disconnection control signal is a low-level signal, and the anti-misclosing circuit is a pull-down circuit.

8. The apparatus according to claim 1, wherein the delay module outputs the disconnection control signal when the microcontroller is reset in a process of outputting the disconnection control signal.

9. The apparatus according to claim 1, wherein the logical circuit comprises an AND-logic circuit.

10. The apparatus according to claim 1, wherein the control signal for the device to be controlled comprises a high-side control signal and a low-side control signal; the first signal end comprises a high-side control end and a low-side control end; the auxiliary circuit comprises a high-side auxiliary circuit and a low-side auxiliary circuit; the logical circuit comprises two AND-logic circuits;
   the high-side control end is connected to a first input end of one of the two AND-logic circuits via the high-side auxiliary circuit, and the low-side control end is connected to a first input end of the other of the two AND-logic circuits via the low-side auxiliary circuit;
   the delay module is connected to a second input end of the two AND-logic circuits respectively.

11. The apparatus according to claim 2, wherein the control signal for the device to be controlled comprises a high-side control signal and a low-side control signal; the first signal end comprises a high-side control end and a low-side control end; the auxiliary circuit comprises a high-side auxiliary circuit and a low-side auxiliary circuit; the logical circuit comprises two AND-logic circuits;
   the high-side control end is connected to a first input end of one of the two AND-logic circuits via the high-side auxiliary circuit, and the low-side control end is connected to a first input end of the other of the two AND-logic circuits via the low-side auxiliary circuit;
   the delay module is connected to a second input end of the two AND-logic circuits respectively;
   the safety control module is connected to a third input end of the two AND-logic circuits respectively.

12. The apparatus according to claim 1, wherein the closing control signal is a high-level signal, and the auxiliary circuit is a pull-up circuit.

13. The apparatus according to claim 1, wherein the output end of the logical circuit is further connected to a fifth signal end of the microcontroller to feed the control signal for the device to be controlled back to the microcontroller; the microcontroller is configured to:
   record the control signal for the device to be controlled at a moment before the microcontroller is reset; and
   initialize the control signal for the device to be controlled to be same as the control signal for the device to be controlled at the moment before the microcontroller is reset during the initialization after the reset is completed.

14. The apparatus according to claim 1, wherein the device to be controlled is a relay and the logical circuit is connected to the relay module.

15. A power supply system, comprising a relay and a control apparatus for controlling the relay;
wherein the control apparatus comprises a microcontroller, an auxiliary circuit, a delay module and a logical circuit;
wherein a first signal end of the microcontroller is connected to a first input end of the logical circuit via the auxiliary circuit, a second signal end of the microcontroller is connected to a second input end of the logical circuit via the delay module, and an output end of the logical circuit is connected to a device to be controlled;
wherein when the microcontroller normally operates, a control signal for the device to be controlled is output to the logical circuit through the first signal end, a delay disabling signal is output to the delay module through the second signal end, and the logical circuit outputs the control signal for the device to be controlled;
wherein when the microcontroller resets, the auxiliary circuit outputs a closing control signal for the device to be controlled to the logical circuit, and the output of the logical circuit is consistent with the output of the delay module; If the microcontroller is reset in a process of outputting a closing control signal, the delay disabling signal becomes invalid, and the delay module is enabled to output the closing control signal within a preset delay time, wherein the delay time is greater than or equal to a reset time of the microcontroller.

16. The system according to claim 15, wherein the control apparatus further comprises a safety control module, and a third signal end of the microcontroller is connected to a third input end of the logical circuit via the safety control module;
the safety control module comprises a monitoring unit; when abnormal communication between the monitoring unit and the microcontroller is monitored by the monitoring unit, the monitoring unit outputs a disconnection control signal for the device to be controlled, and the output of the logical circuit is consistent with the output of the monitoring unit.

17. The system according to claim 16, wherein the closing control signal is a high-level signal, and the disconnection control signal is a low-level signal; the safety control module further comprises a pull-up circuit and an OR-logic circuit;
the third signal end of the microcontroller is connected to a first input end of the OR-logic circuit via the monitoring unit, a fourth signal end of the microcontroller is connected to a second input end of the OR-logic circuit via the pull-up circuit, and an output end of the OR-logic circuit is connected to the third input end of the logical circuit;

the fourth signal end of the microcontroller outputs a high-level signal when the microcontroller is powered on and started but does not establish normal communication with the monitoring unit; the fourth signal end of the microcontroller outputs a low-level signal when the microcontroller is in normal communication with the monitoring unit.

18. The system according to claim 15, wherein the delay module comprises a trigger circuit and a delay circuit;
the second signal end of the microcontroller is connected to a trigger end of the delay circuit via the trigger circuit, and an output end of the delay circuit is connected to the second input end of the logical circuit;
when the delay disabling signal becomes invalid, the trigger circuit triggers the delay circuit to operate by outputting a trigger signal;
wherein the delay module further comprises an anti-misclosing circuit, and the output end of the delay circuit is connected to the second input end of the logical circuit via the anti-misclosing circuit;
the anti-misclosing circuit is configured to output the disconnection control signal for the relay module to the second input end of the logical circuit when the output of the delay circuit is invalid.

19. The system according to claim 15, wherein the control signal for the relay module comprises a high-side control signal and a low-side control signal; the first signal end comprises a high-side control end and a low-side control end; the auxiliary circuit comprises a high-side auxiliary circuit and a low-side auxiliary circuit; the logical circuit comprises two AND-logic circuits;
the high-side control end is connected to a first input end of one of the two AND-logic circuits via the high-side auxiliary circuit, and the low-side control end is connected to a first input end of the other of the two AND-logic circuits via the low-side auxiliary circuit;
the delay module is connected to a second input end of the two AND-logic circuits respectively.

20. The system according to claim 16, wherein the control signal for the device to be controlled comprises a high-side control signal and a low-side control signal; the first signal end comprises a high-side control end and a low-side control end; the auxiliary circuit comprises a high-side auxiliary circuit and a low-side auxiliary circuit; the logical circuit comprises two AND-logic circuits;
the high-side control end is connected to a first input end of one of the two AND-logic circuits via the high-side auxiliary circuit, and the low-side control end is connected to a first input end of the other of the two AND-logic circuits via the low-side auxiliary circuit;
the delay module is connected to a second input end of the two AND-logic circuits respectively;
the safety control module is connected to a third input end of the two AND-logic circuits respectively.

* * * * *